US010426048B2

United States Patent
Hirose (10) Patent No.: US 10,426,048 B2
(45) Date of Patent: Sep. 24, 2019

(54) ELECTRONIC DEVICE ACCOMMODATING HOUSING AND METHOD OF ATTACHING THE SAME

(71) Applicant: DENSO CORPORATION, Kariya, Aichi-pref. (JP)

(72) Inventor: Yoshinori Hirose, Toyota (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 14/829,488

(22) Filed: Aug. 18, 2015

(65) Prior Publication Data

US 2016/0066458 A1   Mar. 3, 2016

(30) Foreign Application Priority Data

Aug. 29, 2014   (JP) .................................. 2014-175858

(51) Int. Cl.
*H05K 5/00*   (2006.01)

(52) U.S. Cl.
CPC ........... *H05K 5/0073* (2013.01); *H05K 5/006* (2013.01)

(58) Field of Classification Search
CPC .............................. H05K 5/0073; H05K 5/006
See application file for complete search history.

(56) References Cited

U.S. PATENT DOCUMENTS

| | | | | | |
|---|---|---|---|---|---|
| 4,088,829 | A | * | 5/1978 | Milcoy | H01H 9/02 174/53 |
| 6,177,631 | B1 | * | 1/2001 | Schindler | H02B 1/30 174/50 |
| 6,671,183 | B2 | * | 12/2003 | Tsuzuki | H05K 7/142 174/250 |
| 6,683,789 | B1 | * | 1/2004 | Sheynis | H05K 5/0069 361/752 |
| 7,190,589 | B2 | * | 3/2007 | Caines | H05K 5/061 174/16.1 |
| 7,654,864 | B2 | * | 2/2010 | Ishiguro | H05K 5/0204 248/548 |

(Continued)

FOREIGN PATENT DOCUMENTS

| | | |
|---|---|---|
| EP | 1887842 A1 | 2/2008 |
| JP | 2007-230329 A | 9/2009 |
| JP | 2013-112270 A | 6/2013 |

*Primary Examiner* — David M Sinclair
*Assistant Examiner* — Theron S Milliser
(74) *Attorney, Agent, or Firm* — Knobbe, Martens, Olson & Bear, LLP (57) ABSTRACT

An electronic device accommodating housing is attached to an attachment member by fastening members, and includes a case main body and a case cover. An electronic device is mounted on the case main body. The case cover is engaged with the case main body to cover the electronic device. One of the case main body and the case cover includes a reference hole and a release hole to be fixed to the attachment member. One of the fastening members fastened to the attachment member passes through the reference hole. An entire circumference of the reference hole is closed. The rest of the fastening members passes through the release hole. A region of the release hole on its circumference is opened so that the rest of the fastening members passing through the release hole is capable of being fallen out of the release hole.

46 Claims, 7 Drawing Sheets

(56) References Cited

U.S. PATENT DOCUMENTS

| | | | |
|---|---|---|---|
| 8,542,512 B2* | 9/2013 | Garrity | H02M 3/338 |
| | | | 361/816 |
| 9,967,993 B1* | 5/2018 | Walker | H05K 5/0221 |
| D827,575 S * | 9/2018 | Oyster | D13/133 |
| 2002/0149918 A1 | 10/2002 | Koyama | |
| 2003/0178217 A1* | 9/2003 | Wang | B23K 1/0008 |
| | | | 174/535 |
| 2009/0017648 A1* | 1/2009 | Sano | H05K 5/0073 |
| | | | 439/76.2 |
| 2009/0166116 A1* | 7/2009 | Kiya | B60K 1/04 |
| | | | 180/68.5 |
| 2009/0226806 A1* | 9/2009 | Kiya | B60K 1/04 |
| | | | 429/186 |
| 2009/0262503 A1* | 10/2009 | Kaneko | H05K 7/026 |
| | | | 361/706 |
| 2010/0101857 A1* | 4/2010 | Miyamoto | H01R 9/2466 |
| | | | 174/559 |
| 2010/0182757 A1* | 7/2010 | Hirose | H05K 5/006 |
| | | | 361/752 |
| 2011/0310574 A1* | 12/2011 | Nomoto | H05K 5/0073 |
| | | | 361/752 |
| 2012/0026703 A1* | 2/2012 | Nomoto | H05K 5/0073 |
| | | | 361/752 |
| 2012/0320544 A1* | 12/2012 | Ohhashi | H05K 5/0052 |
| | | | 361/752 |
| 2013/0205560 A1* | 8/2013 | Ghannam | B60R 16/0239 |
| | | | 29/426.5 |

* cited by examiner

ELECTRONIC DEVICE ACCOMMODATING HOUSING AND METHOD OF ATTACHING THE SAME

CROSS REFERENCE TO RELATED APPLICATION

This application is based on Japanese Patent Application No. 2014-175858 filed on Aug. 29, 2014, the disclosure of which is incorporated herein by reference.

TECHNICAL FIELD

The present disclosure relates to an electronic device accommodating housing that incorporates an electronic device.

BACKGROUND

A control device including an electronic device such as circuit board is accommodated in a housing is used for operation control of all machines irrespective of its purpose or intended use. In a vehicle as well, many control devices are used for controlling in-vehicle devices such as an engine, a transmission, a brake, and an airbag. It goes without saying that normal functions are generally required for these control devices so that the machines, to which they are attached, can successfully operate. However, in the control device disposed in the vehicle, the function of the electronic device needs to be maintained not only when the vehicle is in good condition but also at the time of collision of the vehicle. Particularly, the control device that performs operation control for a body protective device such as an airbag needs to function normally in order to activate the body protective device even if the vehicle is deformed after the collision. In addition, recently, an event data recorder (EDR) that records the data before and after the collision of the vehicle is incorporated in the control device that carries out operation control of the airbag. In order to acquire the date, the control device needs to operate normally for at least a predetermined time even after the actuation of the body protective device.

As a measure against such an issue, there is a conventional art concerned with a control device that is configured to avoid the stress generated at each part of the vehicle after the collision of the vehicle so as to maintain its function normal (see, e.g., JP2002-308021A). This device is a control device including a plate material, to which a circuit board is attached, and a case attached on the plate material to cover the circuit board. Brackets project from the outer peripheral surface of the case, and the control device is fixed to the vehicle by bolting the brackets to the vehicle body. A thin wall part is formed on the lower end surface of the case. When a strain is caused at the vehicle body at the time of the vehicle collision, a breaking is caused at the thin wall part due to the load applied to the case. Accordingly, the applied strain is absorbed by the breaking of the thin wall part. As a result, the circuit board is not affected, thereby maintaining the normal operation of the control device.

As described above, in the case of the control device of the conventional art, the strain caused at the vehicle body is absorbed, for example, by breaking the thin wall part, to which the load is applied. However, there is an issue that the amount of strain for breaking a material of the case varies considerably and that the characteristics for avoiding an impact of the collision are thus not stabilized according to the above-described conventional art. In particular, the case is often formed by aluminum die-casting or the like, and its strength may also vary according to, for example, a casting cavity or pinhole contained.

SUMMARY

The present disclosure addresses at least one of the above issues. Thus, it is an objective of the present disclosure to provide an electronic device accommodating housing that can avoid an applied impact so as to normally operate an electronic device incorporated therein.

To achieve the objective of the present disclosure, there is provided an electronic device accommodating housing for accommodating an electronic device. The housing is adapted to be attached to an attachment member by a plurality of fastening members, and includes a case main body and a case cover. The electronic device is mounted on the case main body. The case cover is engaged with the case main body to cover the electronic device. One of the case main body and the case cover includes a reference hole and a release hole to be fixed to the attachment member. One of the plurality of fastening members fastened to the attachment member passes through the reference hole. An entire circumference of the reference hole is closed. The rest of the plurality of fastening members passes through the release hole. A region of the release hole on its circumference is opened so that the rest of the plurality of fastening members passing through the release hole is capable of being fallen out of the release hole.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

First Embodiment

A controller 1 including a lower case 2 (which may correspond to case main body) and an upper case 3 (which may correspond to a case cover) according to a first embodiment will be described below in reference to FIGS. 1 to 8C. The configuration including the lower case 2 and the upper case 3 may correspond to an electronic device accommodating housing. In the following description, explanations will be given with the upper and lower directions in FIG. 2 referred to as upper and lower directions of the controller 1; the upper side in FIG. 2 as an upper side of the controller 1; and the lower side in FIG. 2 as a lower side of the controller 1. The explanations will be given with the right and left directions in FIG. 3 referred to as a longitudinal direction of each of the controller 1, the lower case 2, and the upper case 3; and the upper and lower directions in FIG. 3 as a width direction of each of the controller 1, the lower case 2, and the upper case 3.

Figure 1:
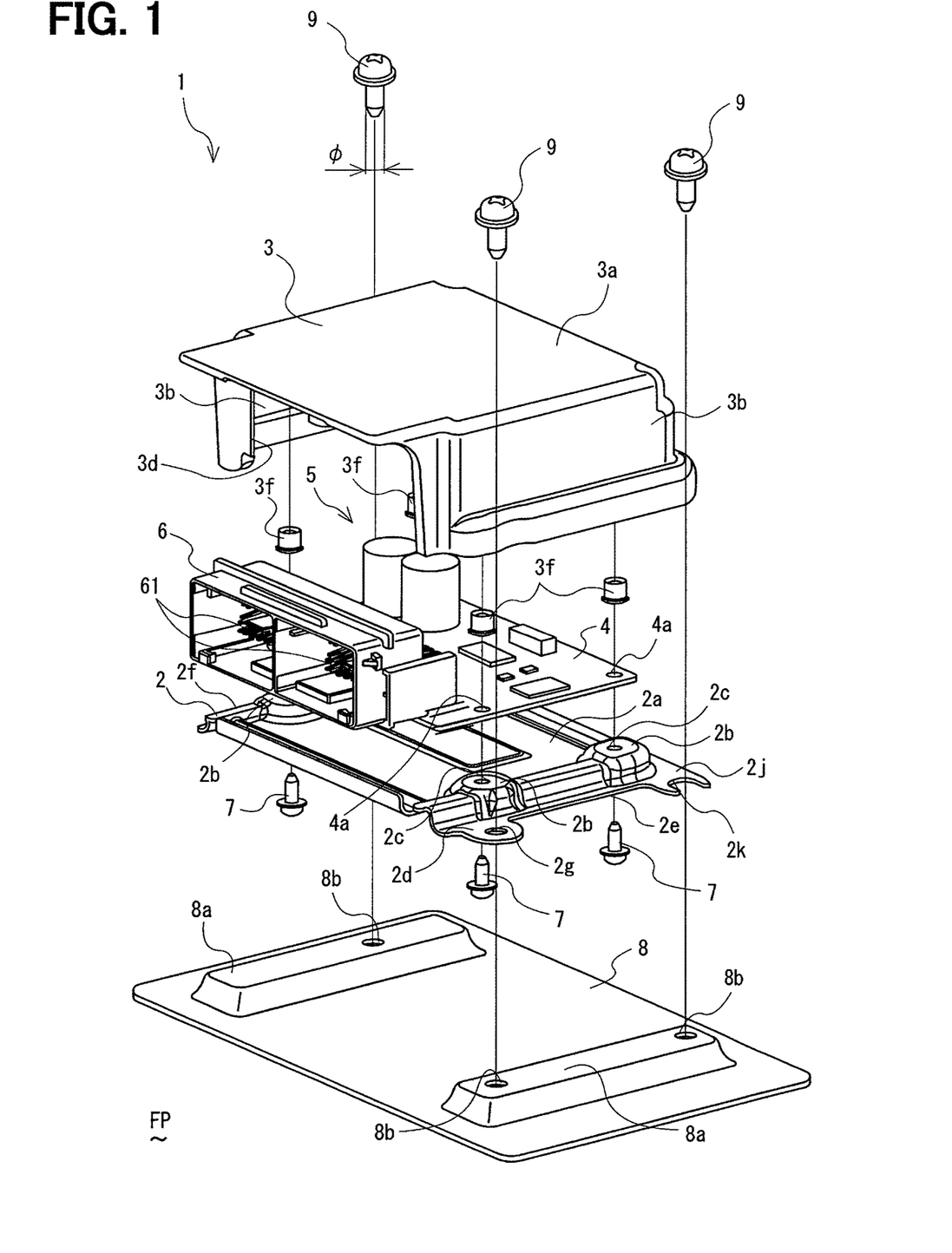
FIG. 1 is an exploded perspective view illustrating a controller including a lower case and an upper case in accordance with a first embodiment.

The controller 1 is a control device that is attached to a vehicle for operating an airbag device (not shown). The controller 1 includes the lower case 2 on which a printed circuit board 4 is mounted, and the upper case 3 that is engaged with the lower case 2 to cover the printed circuit board 4 and an electronic component 5 which will hereinafter be described in detail. The printed circuit board 4 is formed by arranging a patterned wiring (not shown) using, for example, copper foil on a base material having a rectangular shape and impregnated with insulating resin. The electronic components 5 are arranged on the printed circuit board 4. The electronic components 5 include a switching element, a diode, an inductor, and a capacitor which constitute a booster circuit for forming a squib current of the airbag device in addition to a central processing unit (CPU). The electronic components 5 also include an acceleration sensor that detects an impact applied to the vehicle, and an EDR. A connector 6, in which terminals 61 are accommodated, is attached to the printed circuit board 4, and the printed circuit board 4 is formed to enable electric power supply from the outside and exchange of a signal between the printed circuit board 4 and the outside. As will hereinafter be described in detail, screw holes 4a (only two screw holes 4a are shown in FIG. 1) for attaching the printed circuit board 4 to the lower case 2 and the upper case 3 are formed respectively at four corners of the printed circuit board 4. The configuration including the printed circuit board 4 and the electronic components 5 may correspond to an electronic device.

Figure 4:
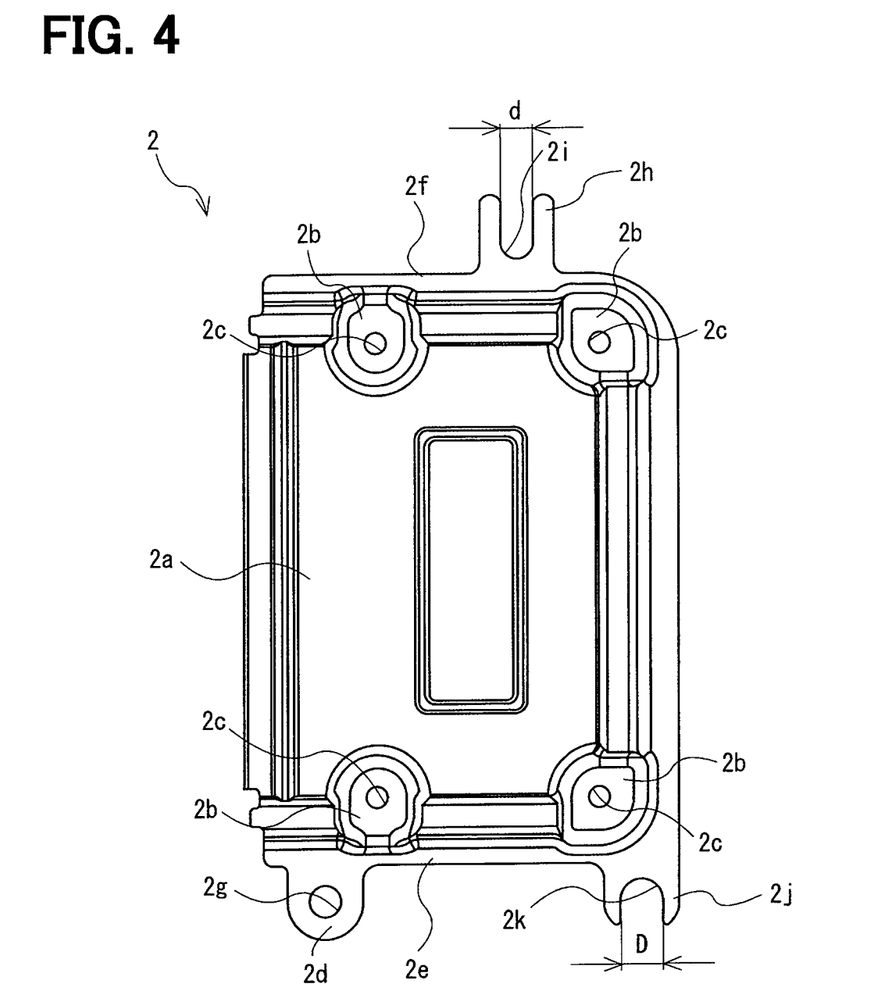
FIG. 4 is a plan view illustrating the lower case in FIG. 1.

The lower case 2 is formed to have a generally rectangular shape in its planar view by press-forming a plate material made of iron such as a rolled steel plate. The lower case 2 is formed by a plate material having thickness of 1 to 3 mm. As illustrated in FIG. 4, the lower case 2 includes a flat plate part 2a having a generally rectangular shape at its central region. Screw seating surfaces 2b which are narrowed toward their upper side are formed respectively at four corners of the flat plate part 2a. A joining hole 2c for fixing the above-described printed circuit board 4 is formed through each screw seating surface 2b. An attachment flange 2d projects from an outer peripheral edge of the flat plate part 2a. The attachment flange 2d projects from one short side 2e of a pair of short sides 2e, 2f of the lower case 2 which are opposed to each other in the width direction, and a reference hole 2g passes through the attachment flange 2d. The reference hole 2g is formed into a shape of a true circle whose entire perimeter is closed. The reference hole 2g is located at one of the corner parts of the lower case 2.

As illustrated in FIG. 4, a first engagement flange 2h projects from the short side 2f of the lower case 2 opposed to the short side 2e from which the attachment flange 2d projects. A first release hole 2i passes through the first engagement flange 2h. The first release hole 2i is formed in such a shape that a certain region of the first release hole 2i on its circumference (end side of the first engagement flange 2h) is opened. Accordingly, the first release hole 2i has a generally U-shape. The first release hole 2i is located generally on the diagonal line of the lower case 2 with respect to the reference hole 2g. A second engagement flange 2j projects from the above-described short side 2e side by side with the attachment flange 2d. The second engagement flange 2j projects in the same direction as the attachment flange 2d. A second release hole 2k passes through the second engagement flange 2j. Similar to the first release hole 2i, the second release hole 2k is formed in such a shape that a certain region of the second release hole 2k on its circumference (end side of the second engagement flange 2j) is opened. Accordingly, the second release hole 2k has a generally U-shape. As illustrated in FIG. 4, a width "D" of the second release hole 2k is larger than a width "d" of the first release hole 2i (D>d). The width "d" of the first release hole 2i has approximately the same size as a shaft diameter $\phi$ of a fastening bolt 9 (d≈$\phi$) which will hereinafter be described in detail. The reference hole 2g, the first release hole 2i, and the second release hole 2k are formed by press-forming the lower case 2.

Figure 5:
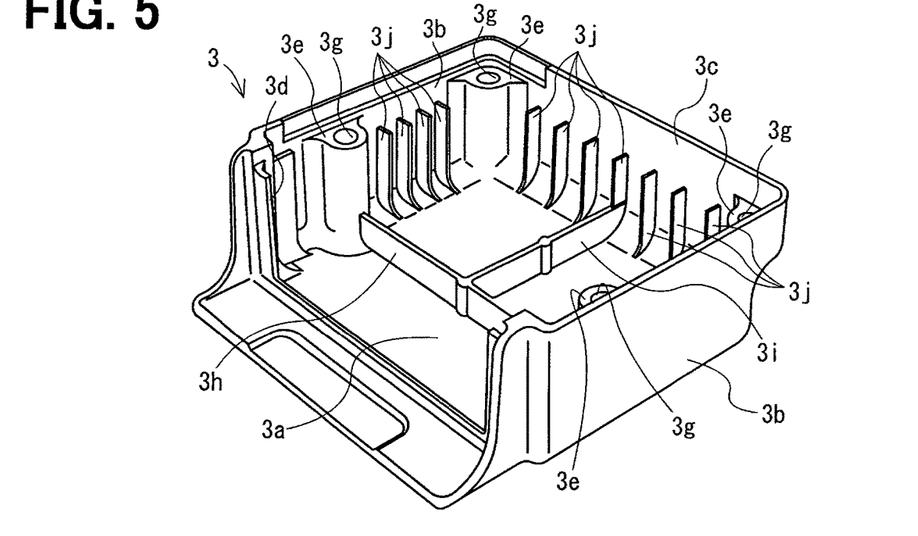
FIG. 5 is a perspective view illustrating an inner peripheral part of the upper case in FIG. 1.
Figure 6:
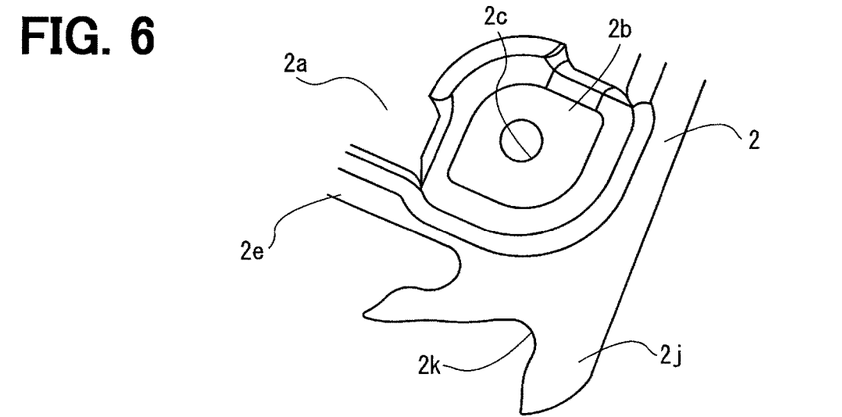
FIG. 6 is a plan view illustrating a state of a second release hole from which a fastening bolt is removed according to the first embodiment.

The upper case 3 is formed integrally from a synthetic resin material, and is formed to have a generally rectangular shape in its planar view. As illustrated in FIG. 5, the upper case 3 includes a top part 3a that has a shape of a flat plate, a pair of longitudinal side plate parts 3b that are joined to the top part 3a and are opposed to each other in the width direction, and a width side plate part 3c that connects together the longitudinal side plate parts 3b. An opening 3d is provided on one side surface of the upper case 3 to be opposed to the width side plate part 3c in the longitudinal direction, thereby forming a space for disposing the above-described connector 6. Connecting bosses 3e extend from a lower surface of the top part 3a (upper surface of the top part 3a in FIG. 5) toward the lower side respectively at four corners of the upper case 3. The connecting boss 3e is integrated with the longitudinal side plate part 3b or with the longitudinal side plate part 3b and the width side plate part 3c. A press-fitting hole 3g, to which a nut member 3f (see FIG. 1) is attached, is formed through the end face of each connecting boss 3e. The nut member 3f is fixed to the press-fitting hole 3g by thermal press-fitting. The nut member 3f is formed from a metallic material, and female screws are provided respectively for the nut members 3f. The nut members 3f are omitted in FIG. 5 illustrating the upper case 3.

A pair of reinforcements 3h, 3i for increasing the rigidity of the upper case 3 project from the lower surface of the top part 3a. The reinforcements 3h, 3i have respective predetermined widths in the upper and lower directions. One reinforcement 3h extends in the width direction on the lower surface of the top part 3a to connect together the connecting bosses 3e respectively with the pair of longitudinal side plate parts 3b therebehind. The other reinforcement 3i extends in the longitudinal direction on the lower surface of the top part 3a to connect together the central portion of the one reinforcement 3h and the width side plate part 3c. Reinforcing ribs 3j (which may correspond to a rib) are formed on an inner peripheral surface of each of the longitudinal side plate parts 3b and the width side plate part 3c. The reinforcing ribs 3j are provided to be arranged in the longitudinal direction or in the width direction on the longitudinal side plate parts 3b and the width side plate part 3c. Each reinforcing rib 3j projects by a predetermined height from the longitudinal side plate part 3b or the width side plate part 3c to extend by a predetermined length in the upper and lower directions. The reinforcing rib 3j may be formed on an outer peripheral surface of the longitudinal side plate part 3b or the width side plate part 3c.

A method of attaching the lower case 2, the upper case 3, and the printed circuit board 4 will be described below. The nut member 3f is attached to the press-fitting hole 3g of the upper case 3 by thermal press-fitting beforehand. In a state where the printed circuit board 4, on which the electronic components 5 and the connector 6 are attached, is mounted on the lower case 2, four screws 7 are inserted respectively into the joining holes 2c of the lower case 2 and into the screw holes 4a of the printed circuit board 4. The upper case 3 is engaged with the lower case 2 from the upper side to cover the printed circuit board 4. By fastening each screw 7 to the nut member 3f, the lower case 2, the upper case 3, and the printed circuit board 4 are joined together, and the controller 1 is thereby completed as illustrated in FIG. 2.

The attachment structure of the controller 1 to the vehicle will be briefly described below. As illustrated in FIG. 1, an attachment bracket 8 (which may correspond to an attachment member) is fixed on a floor panel FP of the vehicle. The attachment bracket 8 is formed from a metal plate material, and is formed into a rectangular shape in accordance with the shape of the controller 1 in its planar view (see FIG. 3). However, the attachment bracket 8 does not necessarily have a rectangular shape. The attachment bracket 8 can be formed in any shape in accordance with the shapes of the floor panel FP, the lower case 2 and the upper case 3, or an attachment direction of the lower case 2 and so forth. The attachment bracket 8 is fixed on the floor panel FP by welding or by a mounting bolt (not shown). A pair of mounting pedestals 8a, which are narrowed down toward the upper side, are formed on the attachment bracket 8. On the attachment bracket 8, the pair of mounting pedestals 8a extend parallel to each other and a predetermined distance away from each other. A pair of fastening holes 8b pass through one mounting pedestal 8a away from each other by a predetermined distance. A fastening hole 8b passes through the other mounting pedestal 8a. The fastening holes 8b provided for the mounting pedestals 8a are all formed to have the same size and shape. The weld nut (not shown) is fixed on a lower surface of the mounting pedestal 8a at a position corresponding to each fastening hole 8b. An upper surface of the mounting pedestal 8a may correspond to a mounting surface. With the controller 1 mounted on the mounting pedestals 8a, the fastening bolts 9 (which may correspond to fastening members) are sequentially passed through the reference hole 2g, the first release hole 2i, and the second release hole 2k of the lower case 2. Then, the fastening bolts 9 are fastened respectively to the weld nuts of the attachment bracket 8. Accordingly, the controller 1 is fixed on the mounting pedestals 8a.

As described above, the reference hole 2g is formed in a shape whose entire circumference is closed. Thus, the fastening bolt 9 is not fallen out of (removed from) the reference hole 2g after the controller 1 is attached to the attachment bracket 8. The first release hole 2i and the second release hole 2k which are release holes formed at the lower case 2 are both formed in a generally U-shape, and a certain region on each of their circumferences is opened. Consequently, the fastening bolt 9 can be fallen out of the first release hole 2i and the second release hole 2k. In a state where the controller 1 is fixed on the mounting pedestals 8a, when a collision occurs with the vehicle to compress the vehicle body, the controller 1 may be urged by another member. In this case, when the displacement amount of the first engagement flange 2h or the second engagement flange 2j due to the urging reaches a predetermined amount or larger, the fastening bolt 9 is fallen out of (removed from) the first release hole 2i or the second release hole 2k, so that the controller 1 can rotate with the reference hole 2g serving as the rotation center (see FIG. 6). As a result, the controller 1 does not receive a load of a predetermined amount or larger by an impact applied at the time of the vehicle collision or a strain produced at the attachment bracket 8. The damage to the electronic components 5 which are attached to the printed circuit board 4 is prevented.

Figure 2:
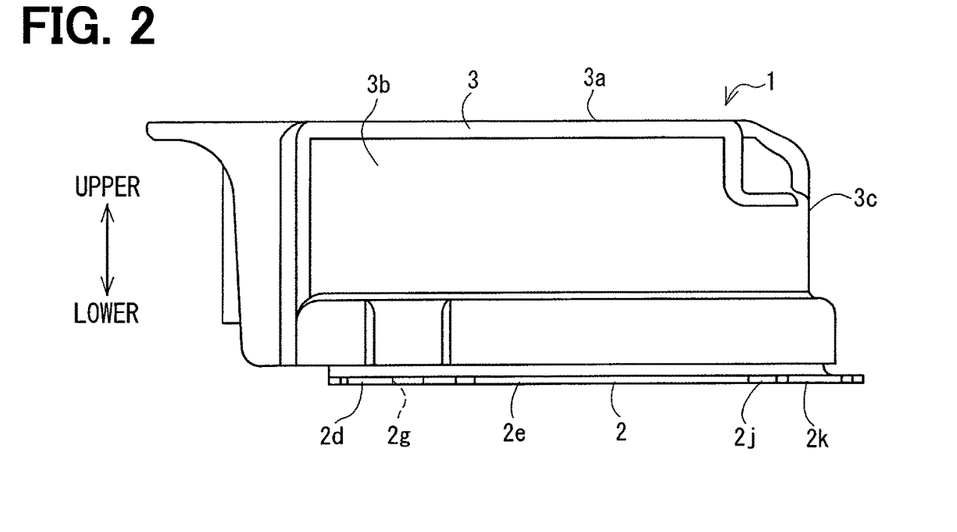
FIG. 2 is a side view illustrating the controller in FIG. 1 when viewed from a side on which a reference hole is formed.
Figure 3:
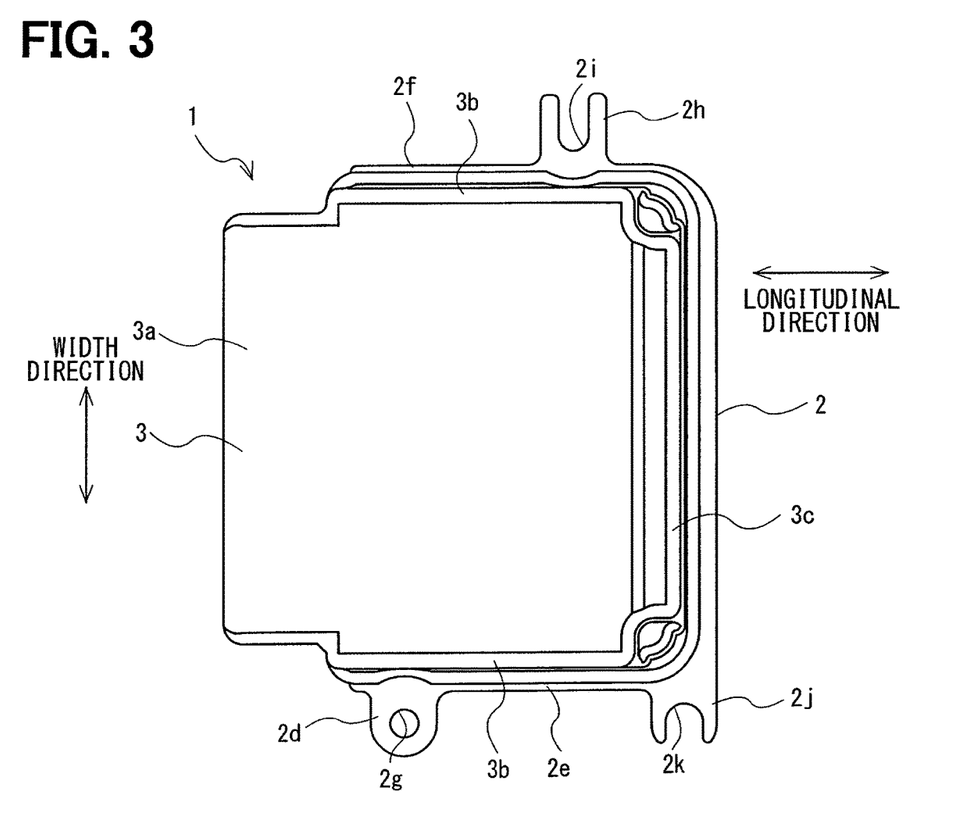
FIG. 3 is a plan view illustrating the controller in FIG. 2.
Figure 7:
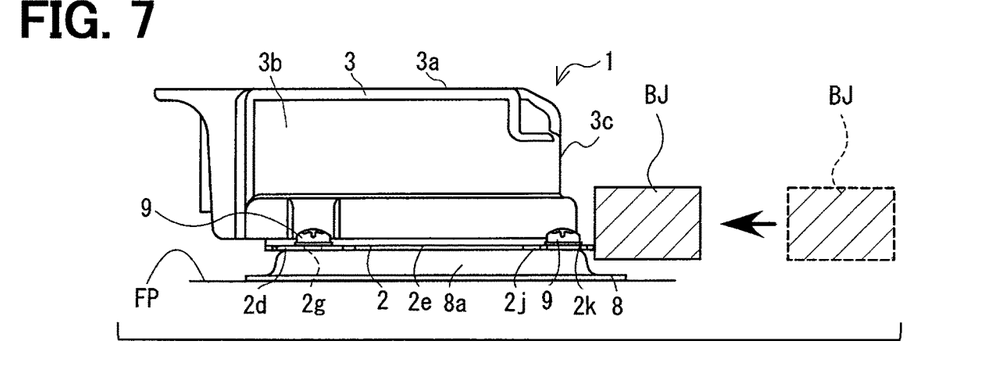
FIG. 7 is a side view illustrating an example of a state in which another member collides with the lower case of the first embodiment.

As illustrated in FIGS. 2 and 3, the outer peripheral edge of the lower case 2 projects out of the longitudinal side plate part 3b and the width side plate part 3c of the upper case 3 in a horizontal direction (which may correspond to a direction in which the mounting surface of the attachment member extends). Hence, when the vehicle body is compressed at the time of the vehicle collision and another member BJ approaches the controller 1 in the horizontal direction as illustrated in FIG. 7, the another member BJ collides with the lower case 2 in advance of the upper case 3.

The process for attachment of the controller 1 to the attachment bracket 8 will be described below with reference to FIGS. 8A to 8C. As described above, a certain region on each of the circumferences of both the first release hole 2i and the second release hole 2k is opened. As a consequence, the fastening bolt 9 is movable in each of the first release hole 2i and the second release hole 2k in the width direction of the controller 1 (which may correspond to a first direction) that is perpendicular to its penetrating direction. The width "d" of the first release hole 2i is provided to have the same size as the shaft diameter $\phi$ of the fastening bolt 9. Accordingly, the fastening bolt 9 cannot be displaced in the first release hole 2i in the longitudinal direction of the controller 1. On the other hand, the width "D" of the second release hole 2k is larger than the width "d" of the first release hole 2i. As a result, the width "D" is larger than the shaft diameter $\phi$ of the fastening bolt 9. For this reason, the fastening bolt 9 is movable in the second release hole 2k in the longitudinal direction of the controller 1 (which may correspond to a second direction) that is perpendicular to both the penetrating direction and the width direction of the controller 1.

Figure 8A:
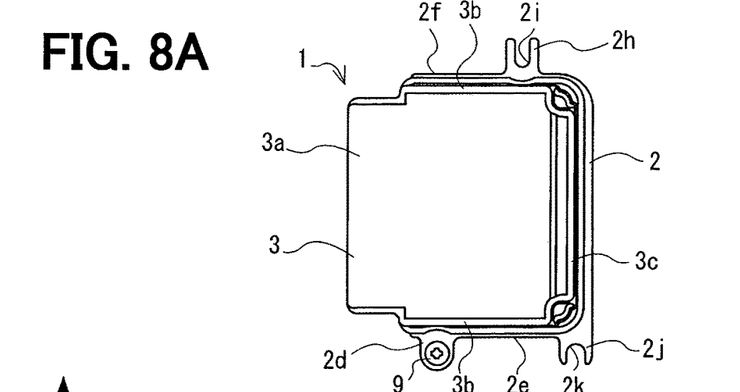
FIG. 8A is a plan view illustrating a process for attaching the controller to an attachment bracket and specifically illustrating a reference position determination process in which the fastening bolt is inserted into the reference hole of the lower case and the attachment bracket according to the first embodiment.
Figure 8B:
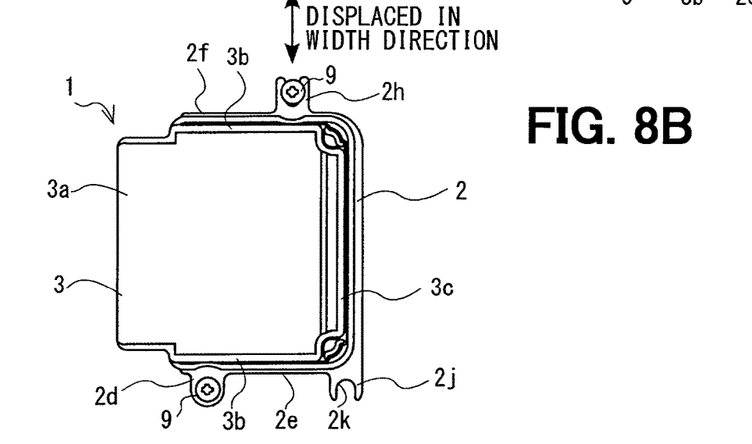
FIG. 8B is a plan view illustrating a first position adjustment process in which a position adjustment of the controller is made in its width direction after the fastening bolt is inserted into a first release hole of the lower case and the attachment bracket according to the first embodiment.
Figure 8C:
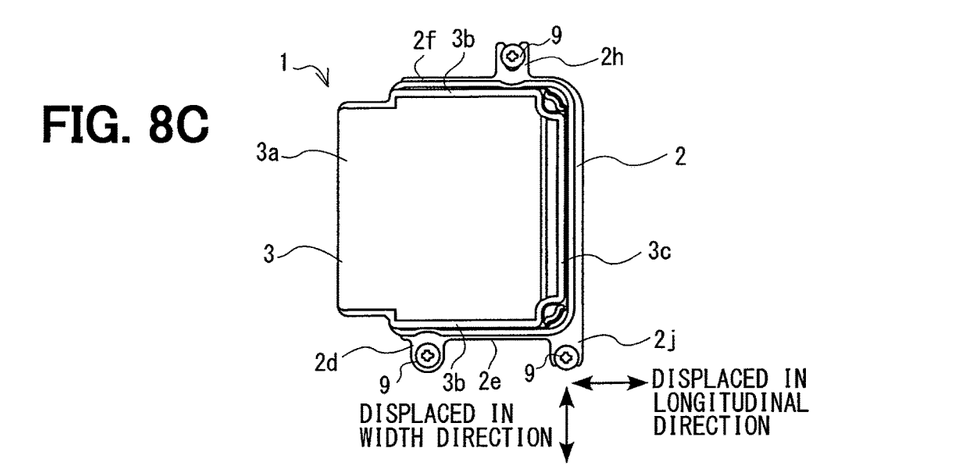
FIG. 8C is a plan view illustrating a second position adjustment process in which a position adjustment of the controller is made in its width direction and longitudinal direction after the fastening bolt is inserted into the second release hole of the lower case and the attachment bracket according to the first embodiment.

When the controller 1 is attached to the attachment bracket 8, first, as illustrated in FIG. 8A, the position of the reference hole 2g and the position of the fastening hole 8b of the attachment bracket 8 are overlapped with each other, and the fastening bolt 9 is inserted into the reference hole 2g and the fastening hole 8b (reference position determination process). After the reference position determination process, as illustrated in FIG. 8B, with the first release hole 2i displaced relative to the fastening hole 8b to make a position adjustment in the width direction of the controller 1, the fastening bolt 9 is inserted into the first release hole 2i and the fastening hole 8b (first position adjustment process). After the first position adjustment process, as illustrated in FIG. 8C, with the second release hole 2k displaced relative to the fastening hole 8b to make a position adjustment in the width direction and the longitudinal direction of the controller 1, the fastening bolt 9 is inserted into the second release hole 2k and the fastening hole 8b (second position adjustment process). Lastly, the fastening bolts 9 which are inserted in the reference hole 2g, the first release hole 2i, and the second release hole 2k are fastened to the attachment bracket 8.

In the present embodiment, the lower case 2 includes the reference hole 2g with its whole circumference closed which through one of the fastening bolts 9 passes; and the first release hole 2i and the second release hole 2k with a certain region on each of their circumferences made open so that the remaining fastening bolts 9 of the fastening bolts 9 passing respectively through the first release hole 2i and the second release hole 2k can fall out of the first release hole 2i and the second release hole 2k. By securing the fastening bolts 9 passing through the reference hole 2g, the first release hole 2i, and the second release hole 2k to the attachment bracket 8, the controller 1 is fixed to the attachment bracket 8. Accordingly, if an excessive impact is applied to the lower case 2 or the upper case 3 at the time of the vehicle collision, the fastening bolt 9 is fallen out of the first release hole 2i or the second release hole 2k, and the lower case 2 and the upper case 3 are thus not affected by the applied impact or the strain produced at the attachment bracket 8. As a result, the printed circuit board 4 and the electronic components 5 which are incorporated in the upper case 3 and the lower case 2 can be protected, thereby enabling their normal operation. When the excessive impact is applied to the lower case 2 or the upper case 3, the fastening bolts 9 are fallen out of the first release hole 2i and the second release hole 2k. Consequently, it is not necessary to break the lower case 2 as in the conventional art, and the lower case 2 is not necessarily limited to a hard and brittle material. Therefore, greater freedom can be given to the choice of the material for the lower case 2.

The lower case 2 includes the reference hole 2g with its whole circumference closed, and the first release hole 2i and the second release hole 2k with a certain region on each of their circumferences made open. Accordingly, when the controller 1 is attached to the attachment bracket 8, after inserting the fastening bolt 9 into the reference hole 2g and the fastening hole 8b, with the first release hole 2i or the second release hole 2k moved relative to the fastening hole 8b of the attachment bracket 8 to make a position adjustment in the width direction or the longitudinal direction of the controller 1, the fastening bolt 9 can be inserted into the first release hole 2i and the fastening hole 8b, or into the second release hole 2k and the fastening hole 8b. Thus, the controller 1 can easily be fixed to the attachment bracket 8. Because the lower case 2 includes the reference hole 2g whose entire perimeter is closed, the position of fixation of the controller 1 to the attachment bracket 8 can easily be determined. If the fastening bolt 9 is removed from the first release hole 2i or the second release hole 2k at the time of the vehicle collision, the controller 1 is expected to rotate with the reference hole 2g, whose entire circumference is closed, as the rotation center. Hence, as a result of the lower case 2 including the reference hole 2g, the locus of the rotation of the controller 1 is predictable, and the controller 1 can be disposed at the most appropriate position on the floor panel FP. As a result of the lower case 2 including the reference hole 2g with its whole circumference closed, even if the fastening bolt 9 is removed from the first release hole 2i or the second release hole 2k at the time of the vehicle collision, the controller 1 can be retained on the attachment bracket 8, and thus the movement of the controller 1 in the vehicle to collide with another member can be prevented. The reference hole 2g is formed at the corner portion of the lower case 2 having a generally rectangular shape, and the first release hole 2i is located on the diagonal line of the lower case 2 with respect to the reference hole 2g. As a consequence, when making a position adjustment of the controller 1 by use of the first release hole 2i, the controller 1 can rotate with the corner portion of the controller 1 as the rotation center to greatly move the first release hole 2i, and this position adjustment can thereby be easily made.

The lower case 2 includes the first release hole 2i and the second release hole 2k. Specifically, the first release hole 2i is formed such that the fastening bolt 9 passing through the first release hole 2i is movable in the width direction of the controller 1 that is perpendicular to the penetrating direction of the fastening bolt 9. The second release hole 2k is formed such that the fastening bolt 9 passing through the second release hole 2k can move in the width direction of the controller 1 and can move in the longitudinal direction of the controller 1 which is perpendicular to both the penetrating direction of the fastening bolt 9 and the width direction. As a consequence, the position adjustment of the controller 1 can easily be made even though accuracy in positions of the reference hole 2g, the first release hole 2i, and the second release hole 2k of the lower case 2 or accuracy in position of the fastening hole 8b of the attachment bracket 8 varies. The lower case 2 and the upper case 3 are attached to the attachment bracket 8 through the reference position determination process in which the fastening bolt 9 is inserted into the reference hole 2g and the fastening hole 8b of the attachment bracket 8, the first position adjustment process in which the fastening bolt 9 is inserted into the first release hole 2i and the fastening hole 8b with the first release hole 2i aligned relative to the fastening hole 8b in the width direction of the controller 1 after the reference position determination process, and the second position adjustment process in which the fastening bolt 9 is inserted into the second release hole 2k and the fastening hole 8b with the second release hole 2k aligned with the fastening hole 8b in the width direction and the longitudinal direction of the controller 1 after the first position adjustment process. Accordingly, the position adjustments between the reference hole 2g, the first release hole 2i, and the second release hole 2k, and the fastening holes 8b of the attachment bracket 8 can reliably be carried out.

The lower case 2 is formed from a metal plate material having a thickness of 1 to 3 mm. As a consequence, at the time of the vehicle collision, when the excessive impact is applied to the lower case 2 or the upper case 3, the fastening bolts 9 can easily be fallen out of the first release hole 2i and the second release hole 2k. When the thickness of the lower case 2 is too large, the rigidity of the lower case 2 increases and thus the fastening bolts 9 are not easily fallen out of the first release hole 2i and the second release hole 2k even when the impact is applied to the lower case 2 or the upper case 3. On the other hand, when the thickness of the lower case 2 is too small, the rigidity of the lower case 2 is extremely reduced, and thus the lower case 2 itself is damaged by the impact applied to the lower case 2 or the upper case 3. When the thickness of the lower case 2 is 1 to 3 mm, the inventor has found that the lower case 2 is not damaged by the impact applied to the lower case 2 or the upper case 3, and that the fastening bolts 9 are fallen most smoothly out of the first release hole 2i and the second release hole 2k. The reference hole 2g, the first release hole 2i, and the second release hole 2k are formed at the lower case 2 by press-forming a plate material, and thus they can easily be provided on the lower case 2. The reference hole 2g, the first release hole 2i, and the second release hole 2k can be formed on the lower case 2 by a single press-forming, and thus a variation in positional accuracy therebetween can be reduced. The lower case 2 is formed from a plate material made of iron, so that the lower case 2 can be produced at low cost and with ease.

The lower case 2 protrudes out of the upper case 3 in a direction in which the mounting surface of the attachment bracket 8 extends. Accordingly, when another member BJ approaches the controller 1 in the horizontal direction at the time of the vehicle collision, the another member BJ collides with the lower case 2 in advance of the upper case 3. As a result, the impact is transmitted to the lower case 2 without applying a load to the upper case 3 so that the fastening bolt 9 can be fallen out of the first release hole 2i or the second release hole 2k. Thus, the upper case 3 which is formed from a resin material can be protected, and the breakage of the printed circuit board 4 and the electronic components 5 can be further prevented. The reinforcing ribs 3j are formed at the longitudinal side plate part 3b and the width side plate part 3c of the upper case 3. As a consequence, the rigidity of the upper case 3 can be improved. Therefore, even if the another member BJ collides with the upper case 3 at the time of the vehicle collision, the upper case 3 is not damaged and the applied impact can be transmit to the lower case 2. Consequently, the functions of the printed circuit board 4 and the electronic components 5 can be reliably maintained. The reference hole 2g is formed in the shape of a true circle. Hence, even when an impact is applied to the controller 1 at the time of the vehicle collision, the controller 1 can be kept securely on the attachment bracket 8 at the reference hole 2g. In addition, the first release hole 2i and the second release hole 2k have a generally U-shape. Accordingly, the fastening bolts 9 can easily be fallen out of the first release hole 2i and the second release hole 2k.

Figure 9A:
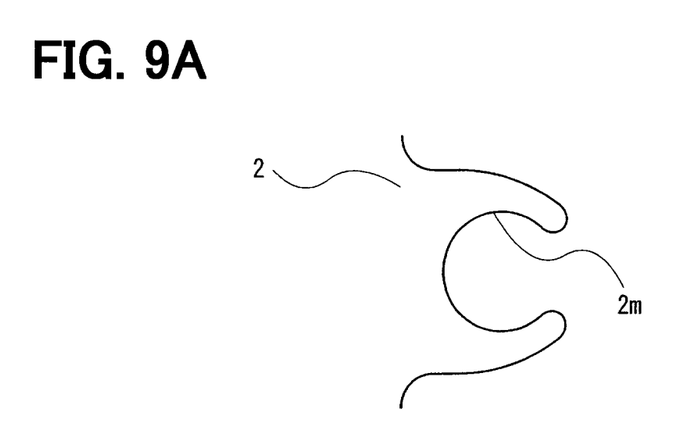
FIG. 9A is a plan view illustrating the second release hole in accordance with a first modification to the first embodiment.

A first modification to the first embodiment will be described below. The shape of the second release hole 2k does not necessarily have a generally U-shape. In the first modification to the second release hole 2k, a second release hole 2m having a generally C-shape may be employed as illustrated in FIG. 9A. In FIG. 9A, it is obvious that the fastening bolt 9 is movable relative to the second release hole 2m in the width direction and the longitudinal direction of the controller 1.

Figure 9B:
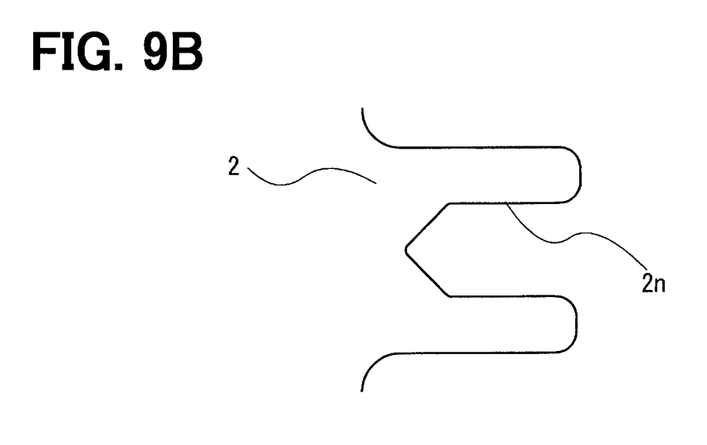
FIG. 9B is a plan view illustrating the first release hole or the second release hole in accordance with a second modification to the first embodiment.

A second modification to the first embodiment will be described below. In the second modification to the first release hole 2i or the second release hole 2k, as illustrated in FIG. 9B, a first release hole 2n or a second release hole 2n the shape of whose deepest portion is set at an angular shape using two straight lines instead of the arc shape may be employed.

Second Embodiment

Figure 10:
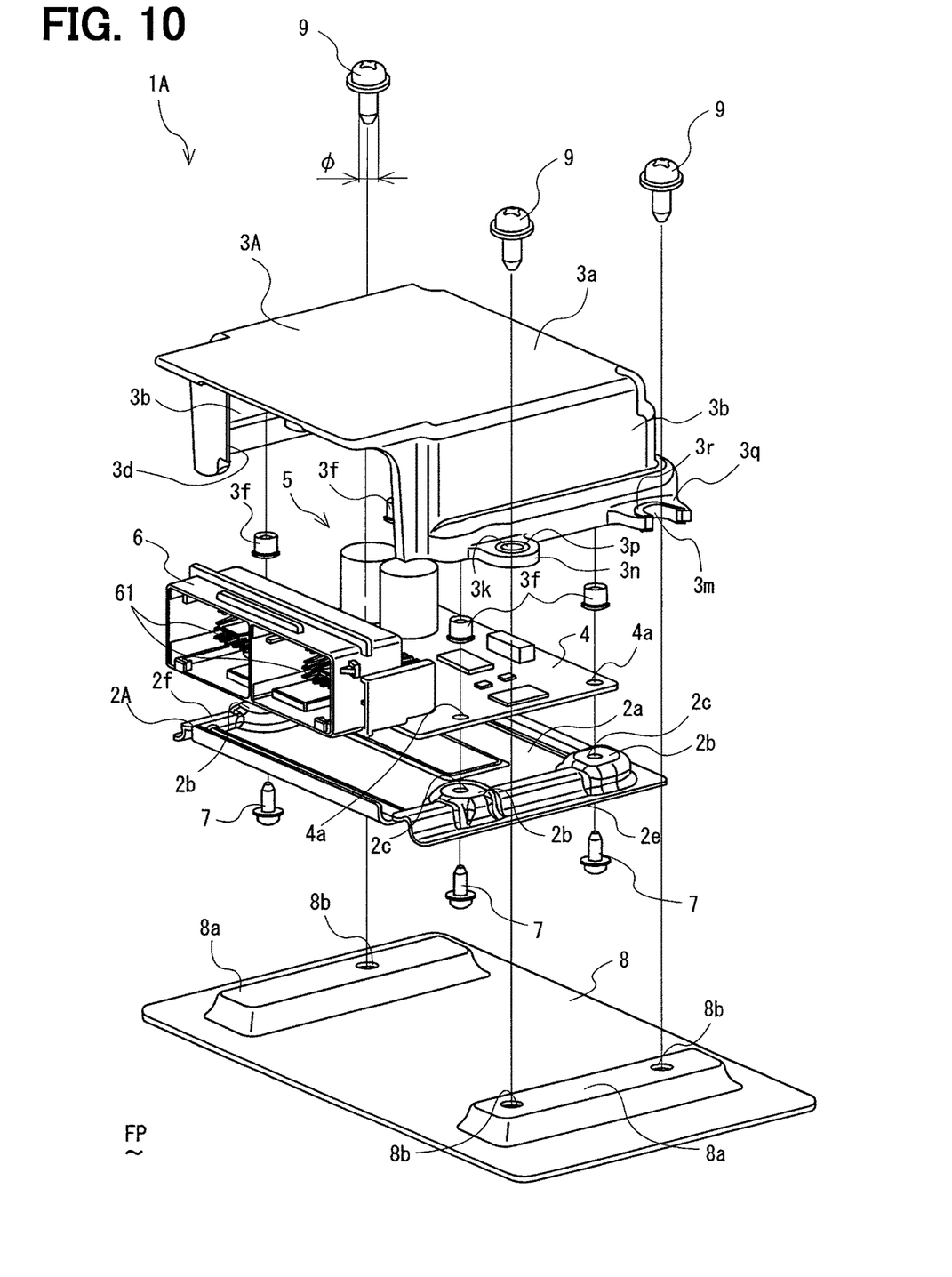
FIG. 10 is an exploded perspective view illustrating a controller including a lower case and an upper case in accordance with a second embodiment.

A controller 1A according to a second embodiment will be described below with reference to FIG. 10. In the present embodiment, a lower case 2A is not provided with the reference hole 2g, the first release hole 2i, or the second release hole 2k. On the other hand, an upper case 3A includes a reference hole 3k, a first release hole, and a second release hole 3m (first release hole is not illustrated in FIG. 10). An attachment flange 3n is formed integrally with the upper case 3A, and a bush 3p which is formed from a metallic material is inserted in the attachment flange 3n. The reference hole 3k is formed on an inner peripheral surface of the bush 3p. A second engagement flange 3q is formed integrally with the upper case 3A, and a collar 3r which is formed from a metallic material is inserted in the second engagement flange 3q. The second release hole 3m is formed on an inner peripheral surface of the collar 3r. Similar to the first embodiment, the reference hole 3k which is formed at the upper case 3A is closed along its whole circumference. Needless to say, a certain region on each of the circumferences of the first release hole and the second release hole 3m is made open such that fastening bolts 9 passing respectively through the first release hole and the second release hole 3m can be fallen out.

The present disclosure is not limited to the above-described embodiments, and can be modified or extended as follows. The electronic device accommodating housing of the present disclosure is applicable not only to those for attachment to the vehicle but also to a controller used for operation control of a household appliance or an industrial machine, for example. The lower case 2 or the upper case 3 may be provided with one release hole, or three or more release hole. When the controller 1 is attached to the vehicle, the controller 1 may be fixed directly on the floor panel FP without using the attachment bracket 8. The release hole which is formed at the lower case 2 or the upper case 3 may have any shape as long as the fastening bolt 9 can be fallen out. The lower case 2, at which the reference hole 2g, the first release hole 2i, and the second release hole 2k are formed, is not necessarily formed from a plate material made of iron. Alternatively, a plate material such as aluminum or stainless steel, or an aluminum die-casting material or a synthetic resin material may be employed for the lower case 2. Additionally, the reinforcing ribs 3j which are formed on the inner peripheral surface of the upper case 3 may be formed to extend not in the upper and lower directions but in the horizontal direction on the longitudinal side plate part 3b or the width side plate part 3c.

Characteristics of the electronic device accommodating housing 2, 3 of the above embodiments can be described as follows.

An electronic device accommodating housing is for accommodating an electronic device 4, 5. The housing 2, 2A, 3, 3A is adapted to be attached to an attachment member 8 by a plurality of fastening members 9, and includes a case main body 2, 2A and a case cover 3, 3A. The electronic device 4, 5 is mounted on the case main body 2, 2A. The case cover 3, 3A is engaged with the case main body 2, 2A to cover the electronic device 4, 5. One of the case main body 2, 2A and the case cover 3, 3A includes a reference hole 2g, 3k and a release hole 2i, 2k, 2m, 2n, 3m to be fixed to the attachment member 8. One of the plurality of fastening members 9 fastened to the attachment member 8 passes through the reference hole 2g, 3k. An entire circumference of the reference hole 2g, 3k is closed. The rest of the plurality of fastening members 9 passes through the release hole 2i, 2k, 2m, 2n, 3m. A region of the release hole 2i, 2k, 2m, 2n, 3m on its circumference is opened so that the rest of the plurality of fastening members 9 passing through the release hole 2i, 2k, 2m, 2n, 3m is capable of being fallen out of the release hole 2i, 2k, 2m, 2n, 3m.

According to this configuration, one of the case main body 2 and the case cover 3 includes the reference hole 2g, 3k through which one of the fastening members 9 passes and whose entire circumference is closed; and the release hole 2i, 2k, 2m, 2n, 3m through which the remaining fastening member 9 of the fastening members 9 passes and a certain region on whose circumference is opened so that the fastening member 9 passing through the release hole 2i, 2k, 2m, 2n, 3m can be fallen out. By securing the fastening members 9 passing respectively through the reference hole 2g, 3k and the release hole 2i, 2k, 2m, 2n, 3m to the attachment member 8, the electronic device accommodating housing 2, 3 is fixed to the attachment member 8. Accordingly, when an excessive impact is applied to the electronic device accommodating housing 2, 3, the fastening member 9 is fallen out of the release hole 2i, 2k, 2m, 2n, 3m, so that the electronic device accommodating housing 2, 3 is not affected by the applied impact or the strain produced at the attachment member 8. As a result, the electronic device 4, 5 incorporated in the electronic device accommodating housing 2, 3 can be protected, thereby enabling normal operation of the electronic device 4, 5.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. An electronic device accommodating housing for accommodating an electronic device, the housing being adapted to be attached to an attachment member by a plurality of fastening members and comprising:
   a case main body on which the electronic device is mounted; and
   a case cover that is engaged with the case main body to cover the electronic device, wherein:
   one of the case main body and the case cover includes a reference hole and a deformable release hole to be fixed to the attachment member;
   the reference hole comprises a closed hole when viewed in a planar view such that an entire circumference of the reference hole is closed;
   the deformable release hole comprises an open slotted hole such that a side of the hole has an open end when viewed in the planar view, the open slotted hole extending in a first direction away from the open end when viewed in the planar view;
   the plurality of fastening members are positioned within the reference hole and the deformable release hole such that the case main body and the case cover are attached to the attachment member;
   the deformable release hole is configured to deform when an impact is applied to the electronic device accommodating housing in a second direction that is perpendicular to the first direction when viewed in the planar view such that the fastening member within the deformable release hole is released from the deformable release hole;
   each of the case main body and the case cover is formed to have a rectangular shape when viewed in the planar view;
   the reference hole and the deformable release hole are located at respective ends of the same side of a pair of sides of the case main body or the case cover that are opposed to each other in the first direction;
   the reference hole is only one reference hole provided further in the second direction than the release hole; and
   the second direction accords with a direction in which a connector attached to the electronic device opens.

2. The electronic device accommodating housing according to claim 1, wherein:
   the reference hole is formed at a corner portion of the case main body or the case cover; and
   the deformable release hole is located on a diagonal line of the case main body or the case cover with respect to the reference hole.

3. The electronic device accommodating housing according to claim 1, wherein:
   the deformable release hole is one of a plurality of deformable release holes that are formed at the case main body or the case cover;
   one of the plurality of deformable release holes is a first deformable release hole which is formed such that a corresponding one of the plurality of fastening members passing through the first deformable release hole is movable in the first direction perpendicular to a penetrating direction of the corresponding one of the plurality of fastening members; and
   the rest of the plurality of deformable release holes is a second deformable release hole which is formed such that a corresponding one of the plurality of fastening members passing through the second deformable release hole is movable in the first direction and is movable in the second direction perpendicular to both of a penetrating direction of the corresponding one of the plurality of fastening members and the first direction.

4. The electronic device accommodating housing according to claim 1, wherein:
   the reference hole and the deformable release hole are provided at the case main body that is formed from a metal plate material having a thickness of 1 to 3 mm; and
   the reference hole and the deformable release hole are formed by press-forming the plate material.

5. The electronic device accommodating housing according to claim 4, wherein the case main body is formed from a plate material made of iron.

6. The electronic device accommodating housing according to claim 4, wherein the case main body protrudes out of the case cover in a direction in which a mounting surface of the attachment member extends.

7. The electronic device accommodating housing according to claim 1, wherein the case cover is formed from a synthetic resin material and includes a rib projecting on a lateral surface of the case cover.

8. The electronic device accommodating housing according to claim 1, wherein:
   the reference hole is formed in a shape of a true circle; and
   the deformable release hole has a U-shape.

9. The electronic device accommodating housing according to claim 1, wherein:
   the deformable release hole comprises an engagement flange that engages the fastening member, and
   the engagement flange is configured to be deformed when the impact is applied to the electronic device accommodating housing such the fastening member is released from the engagement flange.

10. The electronic device accommodating housing according to claim 9, wherein:
the electronic device accommodating housing is configured to rotate about the reference hole when the fastening member is released from the engagement flange.

11. The electronic device accommodating housing according to claim 1, wherein:
the deformable release hole is one of a plurality of deformable release holes that are formed at the case main body or the case cover;
one of the plurality of deformable release holes is a first deformable release hole disposed opposite to the reference hole; and
the rest of the plurality of deformable release holes is a second deformable release hole disposed opposite to the first deformable release hole,
wherein a width of the second deformable release hole is greater than a width of the first release hole.

12. The electronic device accommodating housing according to claim 11, wherein:
the first deformable release hole comprising a first engagement flange and the second deformable release hole comprising a second engagement flange, the first and second engagement flanges each engage one of the rest of the plurality of fastening members, and
at least one of the first and second engagement flanges is displaced when the impact is applied to the electronic device accommodating housing such that the rest of the plurality of fastening members are released from the first and second deformable release holes.

13. An electronic device accommodating housing for accommodating an electronic device, the housing being adapted to be attached to an attachment member by a plurality of fastening members and comprising:
a case main body on which the electronic device is mounted; and
a case cover that is engaged with the case main body to cover the electronic device, wherein:
one of the case main body and the case cover includes a reference hole and a plurality of release holes that permit the case main body or the case cover to be fixed to the attachment member;
one of the plurality of fastening members fastened to the attachment member passes through the reference hole;
an entire circumference of the reference hole is closed;
the rest of the plurality of fastening members passes through a corresponding one of the plurality of release holes; and
a region of each of the plurality of release holes on its circumference is opened to outside in a planar view such that each of the plurality of release holes has an open end when viewed in the planar view, each of the plurality of release holes extending in a first direction away from the open end when viewed in the planar view, each of the plurality of release holes being configured to deform when an impact is applied to the electronic device accommodating housing in a second direction that is perpendicular to the first direction when viewed in the planar view so that a corresponding one of the rest of the plurality of fastening members passing through the release hole falls out of the release hole when the impact is applied to the electronic device accommodating housing, wherein:
one of the plurality of release holes is a first release hole which is formed such that a corresponding one of the plurality of fastening members passing through the first release hole is movable in the first release hole in the first direction perpendicular to a penetrating direction of the corresponding one of the plurality of fastening members;
a width of the first release hole has approximately a same size as a shaft diameter of the corresponding one of the plurality of fastening members passing through the first release hole;
when the impact is applied to the electronic device accommodating housing, the corresponding one of the plurality of fastening members passing through the first release hole falls out of the first release hole to outside;
each of the rest of the plurality of release holes is a second release hole which is formed such that a corresponding one of the plurality of fastening members passing through the second release hole is movable in the first direction and is movable in the second direction perpendicular to both of the penetrating direction of the corresponding one of the plurality of fastening members and the first direction;
a width of the second release hole is larger than the width of the first release hole;
when the impact is applied to the electronic device accommodating housing, the corresponding one of the plurality of fastening members passing through the second release hole falls out of the second release hole to outside;
the case main body formed to have a rectangular shape when viewed in the planar view;
the reference hole and the second release hole are located at respective ends of the same side of a pair of sides of the case main body that are opposed to each other in the first direction;
the reference hole is only one reference hole provided further in the second direction than the release hole;
the second direction accords with a direction in which a connector attached to the electronic device opens; and
the first release hole is located on a diagonal line of the case main body with respect to the reference hole.

14. The electronic device accommodating housing according to claim 13, wherein:
the case main body and the case cover have a rectangular shape in their planar view; and
the reference hole is formed at a corner portion of the case main body or the case cover.

15. The electronic device accommodating housing according to claim 13, wherein:
the reference hole and the plurality of release holes are provided at the case main body that is formed from a metal plate material having a thickness of 1 to 3 mm; and
the reference hole and the plurality of release holes are formed by press-forming the plate material.

16. The electronic device accommodating housing according to claim 15, wherein the case main body is formed from a plate material made of iron.

17. The electronic device accommodating housing according to claim 15, wherein the case main body protrudes out of the case cover in a direction in which a mounting surface of the attachment member extends.

18. The electronic device accommodating housing according to claim 13, wherein the case cover is formed from a synthetic resin material and includes a rib projecting on a lateral surface of the case cover.

19. The electronic device accommodating housing according to claim 13, wherein:
the reference hole is formed in a shape of a true circle; and
the plurality of release holes has a U-shape.

20. The electronic device accommodating housing according to claim 13, wherein:
the plurality of release holes comprises an engagement flange that engages the fastening member, and
the engagement flange is configured to be displaced when the impact is applied to the electronic device accommodating housing such that fastening member falls out of the plurality of release holes.

21. The electronic device accommodating housing according to claim 20, wherein:
the electronic device accommodating housing is configured to rotate about the reference hole when the engagement flange is displaced.

22. The electronic device accommodating housing according to claim 13, wherein:
the release holes are formed at the case main body or the case cover;
one of the plurality of release holes is a first release hole disposed opposite to the reference hole; and
the rest of the plurality of release holes is a second release hole disposed opposite to the first release hole,
wherein a width of the second release hole is greater than a width of the first release hole.

23. The electronic device accommodating housing according to claim 22, wherein:
the first release hole comprising a first engagement flange and the second release hole comprising a second engagement flange, the first and second engagement flanges each engage one of the rest of the plurality of fastening members, and
at least one of the first and second engagement flanges is displaced when the impact is applied to the electronic device accommodating housing such that the rest of the plurality of fastening members fall out of the first and second release holes.

24. An electronic device accommodating housing for accommodating an electronic device, the housing being adapted to be attached to an attachment member by a plurality of fastening members and comprising:
a case main body on which the electronic device is mounted; and
a case cover that is engaged with the case main body to cover the electronic device, wherein:
one of the case main body and the case cover includes a reference hole and a release hole to be fixed to the attachment member;
one of the plurality of fastening members fastened to the attachment member passes through the reference hole;
an entire circumference of the reference hole is closed;
the rest of the plurality of fastening members passes through the release hole; and
a region of the release hole on its circumference is opened such that the release hole has an open end when viewed in the planar view, the release hole extends in a first direction away from the open end when viewed in the planar view, the release hole being configured to deform when an impact is applied to the electronic device accommodating housing in a second direction that is perpendicular to the first direction when viewed in the planar view so that a corresponding one of the rest of the plurality of fastening members passing through the release hole falls out of the release hole when the impact is applied to the electronic device accommodating housing, wherein
the reference hole and the release hole are formed integrally by the same member, wherein
the case main body has a rectangular shape in their planar view;
the only one reference hole is formed at a corner portion of the case main body;
an attachment flange, through which the reference hole passes, includes a corner of the case main body, the corner of the case main body is a meeting point of two sides of the case main body; and
the release hole is located on a diagonal line of the case main body with respect to the reference hole.

25. The electronic device accommodating housing according to claim 24, wherein:
the release hole is one of a plurality of release holes that are formed at the case main body or the case cover;
one of the plurality of release holes is a first release hole which is formed such that a corresponding one of the plurality of fastening members passing through the first release hole is movable in the first direction perpendicular to a penetrating direction of the corresponding one of the plurality of fastening members; and
the rest of the plurality of release holes is a second release hole which is formed such that a corresponding one of the plurality of fastening members passing through the second release hole is movable in the first direction and is movable in the second direction perpendicular to both of a penetrating direction of the corresponding one of the plurality of fastening members and the first direction.

26. The electronic device accommodating housing according to claim 24, wherein:
the reference hole and the release hole are provided at the case main body that is formed from a metal plate material having a thickness of 1 to 3 mm; and
the reference hole and the release hole are formed by press-forming the plate material.

27. The electronic device accommodating housing according to claim 26, wherein the case main body is formed from a plate material made of iron.

28. The electronic device accommodating housing according to claim 26, wherein the case main body protrudes out of the case cover in a direction in which a mounting surface of the attachment member extends.

29. The electronic device accommodating housing according to claim 24, wherein the case cover is formed from a synthetic resin material and includes a rib projecting on a lateral surface of the case cover.

30. The electronic device accommodating housing according to claim 24, wherein:
the reference hole is formed in a shape of a true circle; and
the release hole has a U-shape.

31. The electronic device accommodating housing according to claim 24, wherein:
the release hole comprises an engagement flange that engages the fastening member, and
the engagement flange is configured to be displaced when the impact is applied to the electronic device accommodating housing such that fastening member falls out of the release hole.

32. The electronic device accommodating housing according to claim 31, wherein:

the electronic device accommodating housing is configured to rotate about the reference hole when the engagement flange is displaced.

33. The electronic device accommodating housing according to claim 24, wherein:
the release hole is one of a plurality of release holes that are formed at the case main body or the case cover;
one of the plurality of release holes is a first release hole disposed opposite to the reference hole; and
the rest of the plurality of release holes is a second release hole disposed opposite to the first release hole,
wherein a width of the second release hole is greater than a width of the first release hole.

34. The electronic device accommodating housing according to claim 33, wherein:
the first release hole comprising a first engagement flange and the second release hole comprising a second engagement flange, the first and second engagement flanges each engage one of the rest of the plurality of fastening members, and
at least one of the first and second engagement flanges is displaced when the impact is applied to the electronic device accommodating housing such that the rest of the plurality of fastening members fall out of the first and second release holes.

35. An electronic device accommodating housing for accommodating an electronic device, the housing being adapted to be attached to an attachment member by a plurality of fastening members and comprising:
a case main body on which the electronic device is mounted; and
a case cover that is engaged with the case main body to cover the electronic device, wherein:
one of the case main body and the case cover includes a reference hole and a plurality of release holes that permit the case main body or the case cover to be fixed to the attachment member, the plurality of release holes comprising at least a first release hole and a second release hole;
one of the plurality of fastening members fastened to the attachment member passes through the reference hole;
an entire circumference of the reference hole is closed;
the rest of the plurality of fastening members passes through a corresponding one of the plurality of release holes; and
a region of each of the plurality of release holes on its circumference is opened to outside in a planar view such that each of the plurality of release holes has an open end when viewed in the planar view, each of the plurality of release holes extending in a first direction away from the open end when viewed in the planar view, each of the plurality of release holes being configured to deform when an impact is applied to the electronic device accommodating housing in a second direction that is perpendicular to the first direction when viewed in the planar view so that a corresponding one of the rest of the plurality of fastening members passing through the release hole falls out of the release hole to outside when the impact is applied to the electronic device accommodating housing, wherein
the reference hole passes through an attachment flange, the first release hole and the reference hole are located generally on a diagonal line of the case main body,
a second engagement flange projects in a direction in which a second release hole is opened to outside side by side with the attachment flange,
the attachment flange projects in a same direction as the second engagement flange,
the second release hole passes through the second engagement flange,
the case main body formed to have a rectangular shape when viewed in the planar view,
the reference hole and the second release hole are located at respective ends of the same side of a pair of sides of the case main body that are opposed to each other in the first direction,
the reference hole is only one reference hole provided further in the second direction than the second release hole, and
the second direction accords with a direction in which a connector attached to the electronic device opens.

36. The electronic device accommodating housing according to claim 35, wherein:
the case main body and the case cover have a rectangular shape in their planar view; and
the reference hole is formed at a corner portion of the case main body or the case cover.

37. The electronic device accommodating housing according to claim 35, wherein:
the first release hole is formed such that a corresponding one of the plurality of fastening members passing through the first release hole is movable in the first direction perpendicular to a penetrating direction of the corresponding one of the plurality of fastening members; and
the rest of the plurality of release holes is a second release hole which is formed such that a corresponding one of the plurality of fastening members passing through the second release hole is movable in the first direction and is movable in the second direction perpendicular to both of a penetrating direction of the corresponding one of the plurality of fastening members and the first direction.

38. The electronic device accommodating housing according to claim 35, wherein:
the reference hole and the release hole are provided at the case main body that is formed from a metal plate material having a thickness of 1 to 3 mm; and
the reference hole and the release hole are formed by press-forming the plate material.

39. The electronic device accommodating housing according to claim 38, wherein the case main body is formed from a plate material made of iron.

40. The electronic device accommodating housing according to claim 38, wherein the case main body protrudes out of the case cover in a direction in which a mounting surface of the attachment member extends.

41. The electronic device accommodating housing according to claim 35, wherein the case cover is formed from a synthetic resin material and includes a rib projecting on a lateral surface of the case cover.

42. The electronic device accommodating housing according to claim 35, wherein:
the reference hole is formed in a shape of a true circle; and
the release hole has a U-shape.

43. The electronic device accommodating housing according to claim 35, wherein:
the release hole comprises an engagement flange that engages the fastening member, and the engagement flange is configured to be displaced when the impact is applied to the electronic device accommodating housing such that fastening member falls out of the release hole.

44. The electronic device accommodating housing according to claim 43, wherein:
the electronic device accommodating housing is configured to rotate about the reference hole when the engagement flange is displaced.

45. The electronic device accommodating housing according to claim 35, wherein:
the release hole is one of a plurality of release holes that are formed at the case main body or the case cover;
one of the plurality of release holes is a first release hole disposed opposite to the reference hole; and
the rest of the plurality of release holes is a second release hole disposed opposite to the first release hole,
wherein a width of the second release hole is greater than a width of the first release hole.

46. The electronic device accommodating housing according to claim 45, wherein:
the first release hole comprising a first engagement flange and the second release hole comprising a second engagement flange, the first and second engagement flanges each engage one of the rest of the plurality of fastening members, and
at least one of the first and second engagement flanges is displaced when the impact is applied to the electronic device accommodating housing such that the rest of the plurality of fastening members fall out of the first and second release holes.

* * * * *